United States Patent
Albertini

(10) Patent No.: US 8,494,793 B2
(45) Date of Patent: Jul. 23, 2013

(54) STRUCTURE OF A MAGNETIC-FIELD GRADIENT SENSOR AND PROCESS FOR FABRICATING IT IN INTEGRATED TECHNOLOGY

(75) Inventor: Jean-Baptiste Albertini, Ajaccio (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 203 days.

(21) Appl. No.: 12/990,227

(22) PCT Filed: May 6, 2009

(86) PCT No.: PCT/EP2009/055483
§ 371 (c)(1),
(2), (4) Date: Oct. 29, 2010

(87) PCT Pub. No.: WO2009/135878
PCT Pub. Date: Nov. 12, 2009

(65) Prior Publication Data
US 2011/0046906 A1 Feb. 24, 2011

(30) Foreign Application Priority Data
May 7, 2008 (FR) .................................. 08 53051

(51) Int. Cl.
*G01R 19/00* (2006.01)
*G01R 33/00* (2006.01)

(52) U.S. Cl.
USPC ............................................. 702/64; 324/260

(58) Field of Classification Search
USPC 702/64, 57, 65, 81, 84, 127, 189; 324/117 H, 324/117 R, 200, 207.11, 207.13, 207.2, 207.21, 324/228, 232, 244, 246, 253, 259–260, 262–263
See application file for complete search history.

(56) References Cited

U.S. PATENT DOCUMENTS

| | | | |
|---|---|---|---|
| 3,829,768 A | 8/1974 | Nicol et al. | 324/248 |
| 4,559,495 A | 12/1985 | Lienhard | 324/117 R |

(Continued)

FOREIGN PATENT DOCUMENTS

| | | |
|---|---|---|
| DE | 197 22 834 A1 | 12/1998 |
| DE | 10 2006 021 774 A1 | 1/2007 |

(Continued)

OTHER PUBLICATIONS

Blache et al., New Structures for Linear Displacement Sensor with High Magnetic Field Gradient, Sep. 1992, IEEE Transactions on Magnetics, vol. 28, No. 5, pp. 2196-2198.*

(Continued)

*Primary Examiner* — Toan Le
(74) *Attorney, Agent, or Firm* — Oblon, Spivak, McClelland, Maier & Neustadt, L.L.P.

(57) ABSTRACT

A process for measuring the gradient or an n-th order derivative, in which n is greater than 1, in a direction z, of a component Hx of a magnetic field, the component being invariant, at least locally, in a direction y. The method includes: a) positioning of N (N>n+1) elementary field sensors, each sensor being offset, relative to the neighboring sensors, along y by a distance Ty and along the z axis by a distance $\Delta z$, b) measurement of the field by each of the N sensors, and c) calculation of the desired gradient, or the desired nth-order derivative, as a function of the measurements of the field obtained during b).

16 Claims, 5 Drawing Sheets

U.S. PATENT DOCUMENTS

| | | | |
|---|---|---|---|
| 5,719,494 A | 2/1998 | Dettmann et al. | 324/117 R |
| 6,154,023 A | 11/2000 | Durand | 324/117 R |
| 6,339,328 B1 | 1/2002 | Keene et al. | 324/248 |
| 2005/0073301 A1 | 4/2005 | Herrmann et al. | 324/244 |
| 2007/0164736 A1 | 7/2007 | Joisten et al. | 324/253 |

FOREIGN PATENT DOCUMENTS

| | | |
|---|---|---|
| DE | 10 2006 034 579 A1 | 1/2008 |
| EP | 0 061 520 A1 | 10/1982 |
| FR | 2 670 015 A1 | 6/1992 |
| FR | 2 860 594 A1 | 4/2005 |
| JP | 2001-324518 | 11/2001 |
| WO | WO 94/29733 A1 | 12/1994 |
| WO | WO 98/40757 A1 | 9/1998 |
| WO | WO 01/86670 A1 | 11/2001 |
| WO | WO 03/044541 A1 | 5/2003 |

OTHER PUBLICATIONS

International Search Report issued Jul. 8, 2009 in PCT/EP2009/055483.

French Preliminary Search Report issued Feb. 18, 2009, in French Patent Application No. 0853051 with English translation of category of cited documents.

* cited by examiner

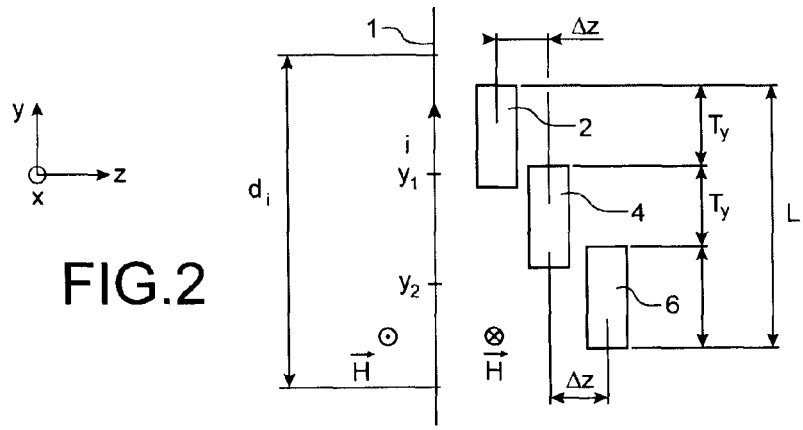
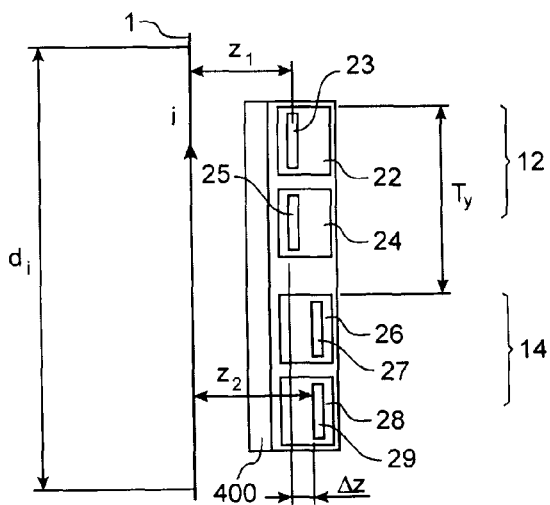
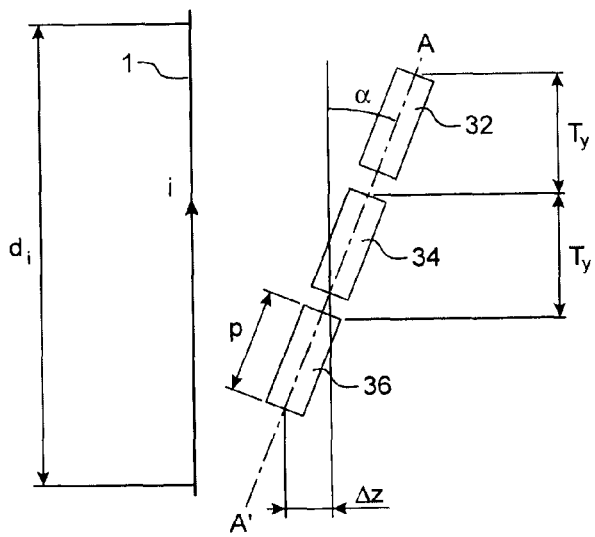

STRUCTURE OF A MAGNETIC-FIELD GRADIENT SENSOR AND PROCESS FOR FABRICATING IT IN INTEGRATED TECHNOLOGY

TECHNICAL FIELD AND BACKGROUND OF THE INVENTION

The invention concerns a device for measuring the gradient of a component of a magnetic field (excitation H or induction B), a process for measuring said gradient, and a process for producing said device. Such a device can be produced in integrated form.

This invention applies in particular to measuring electrical current in filiform conductors.

Known from document WO 03044541 is a method for measuring a current in a conductor, implementing the measurement of n-th order derivatives of the magnetic field. This method makes it possible in particular to reduce the disruptions caused by parasitic conductors.

Let xyz be an orthonormal reference, shown in FIG. 1, centered at the point M where one wishes to conduct the measurement, and where y is parallel to the axis of the conductor 1 (and situated in plane yMz). The z axis is colinear to the radius perpendicular to the conductor passing through M and x is tangent to the circle C passing through M whereof the axis is the conductor. The field H created by the current i circulating in the conductor 1 is then oriented along the axis x and the gradient of Hx is oriented on the axis z. Measuring the gradient of the field Hx created by the current i (which drops with $1/r^2$ as a function of the distance r from the conductor 1), or higher-order derivatives (which drop even more quickly as a function of r), makes it possible to go back up to the current i. This technique makes it possible to better do away, in a noisy environment, for example an electric cabinet, with external disruptions, which allows direct measurement of the field Hx (which is dropping, but only with 1/r). Measuring a current i1 in a conductor C1, in the presence of (disrupting) conductors C2, C3, ... Cn, which are also passed through by currents i2, i3, ... in, is thus made easier, due to the measurement of the gradient of the component Hx of the field H (or a derivative of an order higher than 1 of the same component) created by said conductor, at a short distance therefrom, than direct measurement of the field Hx. A configuration is thus sought in which the contributions to the measured size, caused by the disrupting conductors, are extremely low, while that caused by the main conductor C1 is as strong as possible.

The implementation of this technique poses several problems.

To maximize the signal, it is advantageous to position the sensors (N sensors for an N−1 order derivative) very close to the conductors where one wishes to perform the measurement. The problem then arises of reducing the distances separating these sensors from the conductor 1, as well as the distances separating the sensors from each other, as much as possible.

Thus, to effectively and precisely measure the current, it is advisable to perform the measurement at points situated as close as possible to the conductor 1, at distance r from the center thereof. It would also be advisable, to precisely measure the derivatives of the field, for the distances between sensors to be smaller than r and, if possible, small in view of r.

One solution would be to miniaturize the sensors. But if the sensors are miniaturized, their environment (and in particular their packaging) could impose minimal dimensional constraints, which can sometimes be bothersome, as in the configuration of FIG. 5 described in document U.S. Pat. No. 6,154,023.

It is therefore difficult, in certain cases, to reduce the distance d between the different sensors.

It would also be advantageous to be able to use, for this type of measurement, very directional sensors, such as micro fluxgates, or magneto-impedances, or magneto-resistances with flux guides. Yet the magnetic circuits of these sensors disrupt each other when the sensors are brought too close, resulting in a less precise measurement.

Precise measurement of the gradient also demands sensors whereof the positions in relation to each other are very well known. Moreover, if they are very directional (which is advantageous to perform a non-noisy measurement), they must be parallel to each other, which is very delicate to achieve with discrete sensors, in particular when they are miniaturized.

Another problem arises during use of a gradient sensor in an industrial environment. In this context it may sometimes be necessary to use the sensor inside a magnetic shielding, which, although it has the advantage of reducing disrupting fields, also has the drawback of creating a relatively significant field gradient in its immediate vicinity. The problem then arises of having a gradient sensor small enough to avoid one of the elementary sensors making it up being too close to the shielding, which could disrupt the measurement.

The problem also arises of being able to have a sensor structure that can be made in collective technology, for example with machines of the types used in microelectronics or micro- or nano-technologies.

BRIEF DESCRIPTION OF THE INVENTION

Hereinafter, "gradient" refers to the spatial derivative vector of order n=1 of a component (here called x) of the magnetic field (in particular commonly H).

The invention first concerns a method for measuring an n-th order derivative ($n \geq 1$), in relation to z or x, of a magnetic field component $H_x$, invariant, at least locally, in direction y (x, y and z being perpendicular two by two).

The invention in particular concerns a method for measuring the gradient, or an n-th order derivative ($n \geq 1$), in a direction z or x, of a component $H_x$ (in direction x) of a magnetic field, said component being invariant, at least locally, in a direction y, direction x, y, and z being perpendicular two by two.

This method includes:
 a) the positioning of N (N>1) elementary field sensors in a zone in which said magnetic field component is invariant in a direction y, and offset, in relation to the preceding and/or following sensor or in relation to the immediately adjacent sensors:
  along y, by a distance (offset) Ty,
  along the z axis, by a distance Δz (when the field is created by a current circulating in a conductor positioned along y, Δz is the deviation of the sensors relative to the y axis);
 b) the measurement of the field by each of the N sensors,
 c) the calculation of the value of the gradient, or of an n-th order derivative less than or equal to N−1, as a function of the measurement values of the field obtained during step b).

The invention makes it possible, through the presence or adjustment of the distance (offset) Ty of one elementary sensor in relation to the adjacent elementary sensors (preceding and/or following), to reduce the disruptions caused by the proximity of the magnetic portions of the adjacent elementary sensors.

Preferably, the distance Ty is such that the mutual disruption of the adjacent elementary sensors is low.

The invention makes it possible to perform a measurement in the case where the component to be measured of the magnetic field is invariant (at least over a short distance) in a direction y perpendicular to the direction z along which one wishes to measure the gradient.

The invention makes it possible to measure the gradient, or an n-th order derivative less than or equal to N−1, of a component $H_x$ of the field from sensors, in particular when they are very directional, i.e. having strong selectivity of the measurement of a component of the field and also when these field sensors have a magnetic circuit or a flow guide, such as for example micro-fluxgate, magneto-resistance or magneto-impedance sensors.

The invention is in particular applicable to the current measurement in electrical wires via magnetic field sensors situated near said wires. Indeed, by its nature, the magnetic field created by the rectilinear filiform conductor oriented in a direction y indeed has an invariance along y, since there is a cylindrical distribution of the field along the y axis.

The invention therefore also concerns a current measuring process in a current line, positioned along an axis (y), including:
  implementing a measuring method according to the invention, as described above,
  calculating the current.

The invention also concerns a device for measuring the gradient, or an n-th order derivative (n>1), in a direction z or x, of a component $H_x$ of a magnetic field, said component being invariant, at least locally, in a direction y (x, y, and z being perpendicular two by two), including:
  N (N>n) elementary field sensors to be positioned in a zone in which said magnetic field component is invariant in a direction y, each sensor being offset, in relation to the immediately adjacent sensors, preceding and/or following:
  along y, by a distance Ty,
  along z, by a distance Δz, for a measurement of the component z of the gradient or of the n-th order derivative, or along the x axis, by a distance Δx, for a measurement of the component x of the gradient or of the n-th order derivative,
  means for calculating the value of the desired gradient, or a desired n-th order derivative (n≧1), as a function of the measurements, for example differential, of the field that are obtained using said sensors.

Preferably the distance Ty is such that the mutual disruption of the adjacent sensors is low.

The invention therefore also concerns a device including N elementary field sensors, in order to enable the measurement of a field or its gradients, when the N sensors are distributed along a direction y, along which the gradient to be measured (and advantageously its derivatives) does not vary, at least locally.

In a method or device according to the invention, the measurement of the component z of the gradient of the component x of the field H at point M(x,y,z) may be done, according to the invention, by measuring Hx at point M(x,y,z) then at point M'(x,y+Ty,z+Δz), then by calculating the quantity:

$$\text{grad}_z Hx = (Hx(x, y+Ty, z+\Delta z) - Hx(x,y,z))/\Delta z.$$

Other formulas yield higher order derivatives.

In a method or a device according to the invention, the sensors:
  can be micro-sensors,
  can be integrated on a shared substrate,
  can be aligned along an axis (AA') forming an angle α with the y axis,
  can be of the micro-fluxgate or magneto-resistive (in particular AMR, GMR or TMR) or magneto-impedance type.

The sensors of a device according to the invention can advantageously be positioned on, or made in, a same substrate, for example silicon, possibly covered by an insulating layer.

A device according to the invention can be made by collective fabrication, for example by micro-nanotechnological methods (or micro-electronics or thin magnetic layers), even in the case where the elementary sensors are all made on a same substrate (preferably an insulating layer covering up a silicon substrate):
  each elementary sensor of a same device having its magnetic core(s) on a distinct side in relation to the substrate,
  or: each elementary sensor of a same device having its magnetic core(s) on a same side in relation to the substrate, the plane of the support of the device, advantageously cut out in the substrate, being positioned so as to have an angle α with the y axis during use to measure a field or an n-th order derivative of that field.

The invention also concerns a method for producing a device according to the invention.

A device according to the invention can include shielding (situated away from said sensor).

In a method and a device according to the invention, the distance $T_y$ can be determined so as to be able to perform a measurement with a predefined precision p.

BRIEF DESCRIPTION OF THE DRAWINGS

FIG. 2 shows an embodiment of a sensor according to the invention.

FIG. 3 shows another embodiment of a sensor according to the invention.

FIG. 4 shows still another embodiment of a sensor according to the invention.

DETAILED DESCRIPTION OF SPECIFIC EMBODIMENTS

Figure 1:
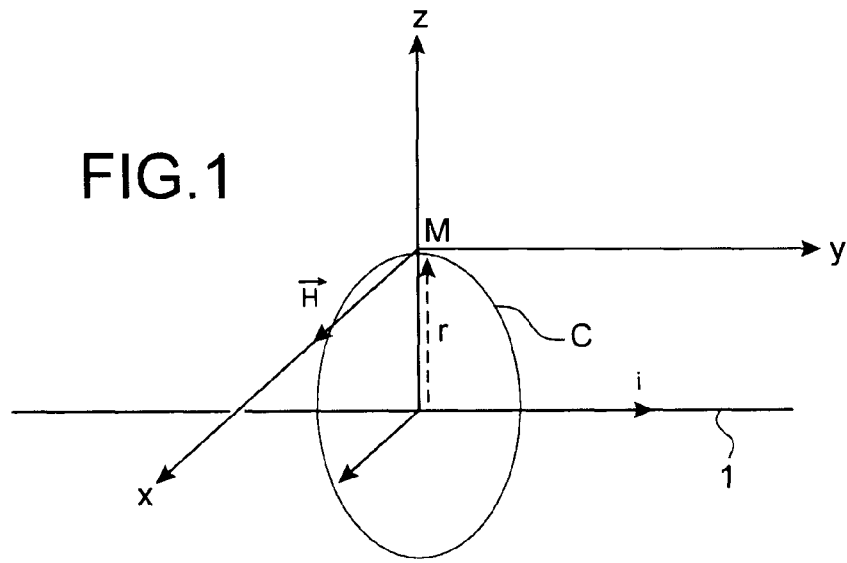
FIG. 1 shows an orthonormal reference Mxyz, as well as the magnetic field vector H created by a filiform linear conductor 1 passed through by a current i.

The invention can be used for macroscopic sensors as well as miniaturized/integrated sensors. But it is particularly well adapted to an implementation of sensors of the type developed in microtechnology.

A first embodiment of the invention is shown in FIG. 2.

In that figure, a conductor 1 is aligned in a direction Oy in a reference Oxyz. The current i circulating there creates a magnetic field H in the surrounding space, this field having components Hx, Hy, Hz in the chosen reference.

The elementary sensors 2, 4, 6 of this figure illustrate the case where N=3 sensors, making it possible to measure derivatives up to the n=N−1=2 order. Each elementary sensor can for example advantageously be chosen as a micro-fluxgate magnetometer, with 1 or 2 cores, oriented along the x axis and the thickness of which goes along the z axis.

This structure according to the invention makes it possible to measure the gradient of a component of the field H, here Hx, along direction z or x, or $dH_x/dz$ or $dH_x/dx$, using 2 elementary sensors, for example sensors 2, 4. It also makes it possible to measure the second derivative of $H_x$ along z or x, or $d^2H_x/dz^2$ or $d^2H_x/dx^2$, using the three illustrated elementary sensors 2, 4, 6.

To that end, it is assumes that the component $H_x$ of the field H, therefore its derivatives up to the n-th order, are invariant along a direction y, perpendicular to the direction z along which one wishes to measure the gradient, at least over a short distance $d_i$. For any pair of points $(x,y_1,z)$ and $x, y_2,z)$ chosen in a certain volume around the conductor in this zone with distance $d_i$:

$$H_x(x,y_1,z)=H_x(x,y_2,z)$$

And:

$$dH_x(x,y_1,z)/dx=dH_x(x,y_2,z)/dx$$

The measurement of the gradient $dH_x/dz$, or $dH_x/dx$, or the second or any n-th order derivative may be done by applying formulas given later.

The magnetic field created by the rectilinear filiform conductor 1 oriented in a direction y indeed has an invariance along y, since there is a cylindrical distribution of the field along the y axis. A rectilinear conductor, like that of FIG. 2 or of FIGS. 3 and 4, therefore makes it possible to satisfy the condition of invariance of the field along y.

The value of $d_i$ will in fact be greater than the extension L of the device, along the direction y. For example, for a device including three elementary micro-sensors, as in FIG. 2, each having a length, in direction y, of about 1 mm, L will be substantially between 2 mm and 5 mm, whereas $d_i$ will then be greater than 3 mm or 10 mm.

The same condition on the longitudinal extension L (L<di) is applicable to the devices of the other embodiments of FIGS. 3 and 4.

In FIG. 2, three elementary sensors 2, 4, 6 are shown in the yz plane, which makes it possible to measure 1st or 2nd order derivatives. But the number of elementary sensors can be generalized to N, which makes it possible to measure any derivative along z of an order less than or equal to N−1 of the component $H_x$ of the field. A device with only elementary sensors 2, 4 would make it possible to measure only the gradient.

The magnetic circuit of each elementary sensor 2, 4, 6 is positioned parallel to the x axis. The projection on the y axis of each magnetic circuit does not cover, even partially, the projection, on the y axis, of the magnetic circuits of the adjacent sensors. Practically, each sensor is offset, along y, by a distance $T_y$ in relation to the adjacent sensors. This distance $T_y$ is preferably chosen such that the adjacent elementary sensors cannot mutually disrupt each other. A method for determining $T_y$ is given later. $T_y$ is also the pitch of the translation vector between two successive elementary sensors along the y axis.

Moreover, two adjacent circuits are offset, in plane yz, along the z axis, by a distance Δz, preferably small in relation to z, for example Δz/z<1% or 5%. But a value of the ratio Δz/z between 10% and 50% may also be acceptable for the invention.

For example, for z≈1 mm or 2 mm, Δz is preferably chosen in the vicinity of several tens of μm.

The same considerations are valid for Δx and Δx/x.

The sensors of FIG. 2 can be mounted on 2 or 3 (or N>3) different integrated circuits.

Alternatively, they are mounted on a same integrated circuit, which has the additional advantage of resolving the problem of the precise positioning of one sensor in relation to the other and of their parallelism, the elementary sensors then being positioned beforehand in the plane in which they are mounted. When the sensors are micro-sensors and are made on a same integrated circuit, the precision is at least that of photolithography. They are therefore then positioned much more precisely than with any other positioning or micro-positioning technique.

Thus, FIG. 3 provides an example of a gradient sensor produced on a silicon chip 400. Two elementary sensors 12, 14 are implemented. Each sensor here is of the micro-fluxgate type, with a dual magnetic core, in particular as described in document FR 2860594 or FR 2900735. But it is also possible to use two micro-fluxgate sensors with single magnetic cores, or N (N>2) micro-fluxgate sensors, each with a dual or single magnetic core. In the case of FIG. 3 (dual magnetic core sensors), the cores 23, 25 of the first sensor are situated at a distance z1 from the conductor 1 and the cores 27, 29 of the second sensor at a distance z2 from the conductor 1.

The length of the magnetic cores is oriented along the x axis perpendicular to FIGS. 1-3 (axes of the field lines H created by the conductor passed through by the current i).

The solenoid conductive coils are shown by the boxes 22, 24, 26, 28 surrounding the cores in the cross-section of FIG. 3. These coils can be made in a common manner on the entire chip for the set of elementary sensors (as indicated in FIG. 3), the offset $\Delta z=z_2-z_1$ of the magnetic cores making it possible to pick up the field at the two desired distances to calculate the gradient.

An offset $\Delta z=z_2-z_1$ of a few μm can be produced easily by depositing a layer of insulator (for example SiO2) with a thickness Δz, after having produced the cores of the first elementary sensor and before depositing those of the second. It is also possible to deposit a thick insulating layer, then selectively etch it at two different depths at the location of the first elementary sensor and the location of the second.

The distance Ty ("pitch" of the elementary sensors) separates the two elementary sensors on the chip. The distribution of the sensors of FIG. 3 makes it possible to meet this condition. The sensor 12 is situated at a distance Ty from the sensor 14, such that the condition of non-covering along the y axis is met.

Still another embodiment will be explained using FIG. 4.

N elementary sensors (N=3 in the case of FIG. 4) are positioned aligned along a shared axis AA'. Their magnetic circuits are oriented along the x axis. Along the axis AA', the condition of a deviation between two adjacent sensors is met so they do not disrupt each other (the pitch p is assumed to be sufficient for this).

The axis AA' is inclined in relation to the conductor 1 by an angle α sufficient to have the desired deviation Δz=p·sin(α) (or $T_y$=p·cos(α)) between two consecutive elementary sensors. This angle α is preferably small enough for the measurement of each elementary sensor not to be disrupted by the angle α. Typically, this can be between 1° and 15°.

This embodiment is completely compatible with, and adapted to, a production of identical elementary sensors on a same substrate or on a same chip. It indeed makes it possible to produce the offset $\Delta z=z2-z1$ easily, simply by inclining the set of sensors in relation to the y axis of the conductor 1. In the embodiment provided below, the magnetic layers are deposited at the same level on the chip, and the elementary sensors are offset with a pitch p on the axis AA'. The offset $\Delta z$ comes from the incline of the chip in relation to the axis of the conductor.

From each of the devices of FIGS. 2-4, it is possible to measure the component in z of the gradient of the component x of the field H at the points where the sensors are positioned in the plane y,z. By rotating the device 90° around the y axis, it is possible to measure the component in x of the gradient of the component z of the field H at the points where the sensors are positioned in the plane y, x.

It is also possible to measure the component, along the direction x of the gradient $H_x$, or of its higher-order derivatives, by offsetting the elementary sensors by a pitch $\Delta x$ along the x-axis instead of doing so along the z axis as in FIGS. 2, 3, 4. It is then possible to perform the measurements according to the invention, in a same plane with constant z coordinate, for example with "micro-fluxgate" sensors, the elementary sensors having cores aligned along the x axis, each being offset by $\Delta x$ in relation to the x axis and $T_y$ along the y axis, in relation to the preceding and/or following one.

Figure 9A:
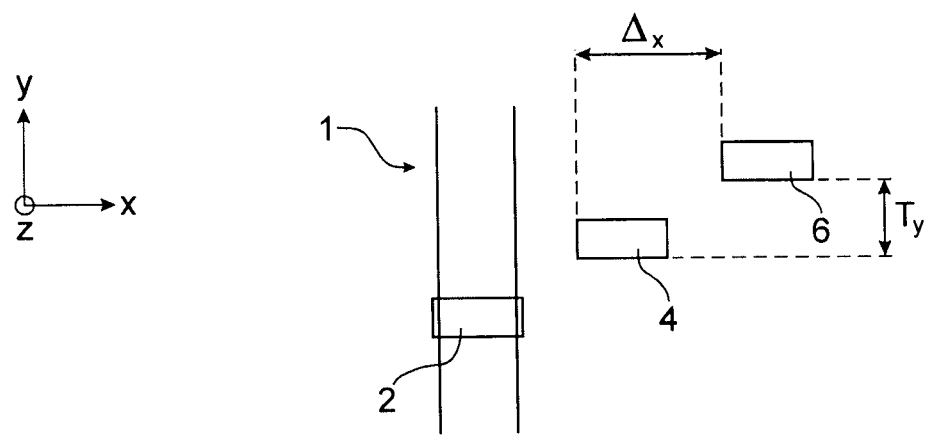
FIGS. 9A and 9B show two other arrangements of 3 elementary sensors according to the invention.
Figure 9B:
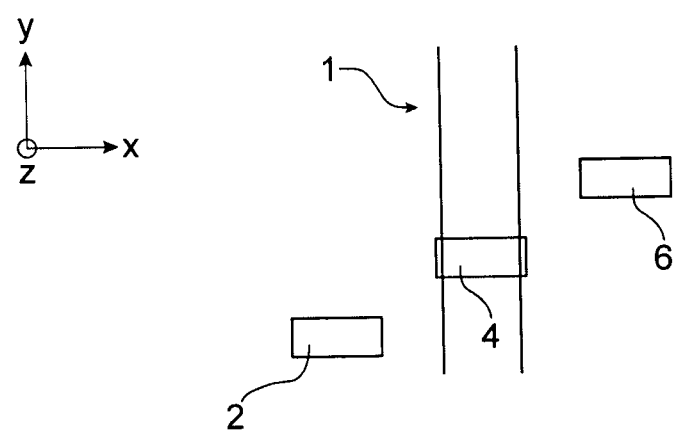

Thus, FIG. 9a shows the case of three sensors situated in a plane z=Constant situated above the conductor 1. The three elementary sensors 2, 4, 6 are positioned in a plane xOy with an offset Ty between them on the y axis and $\Delta x$ on the x axis. FIG. 9B shows the case of three sensors, the assembly being centered above the conductor 1.

Figure 5:
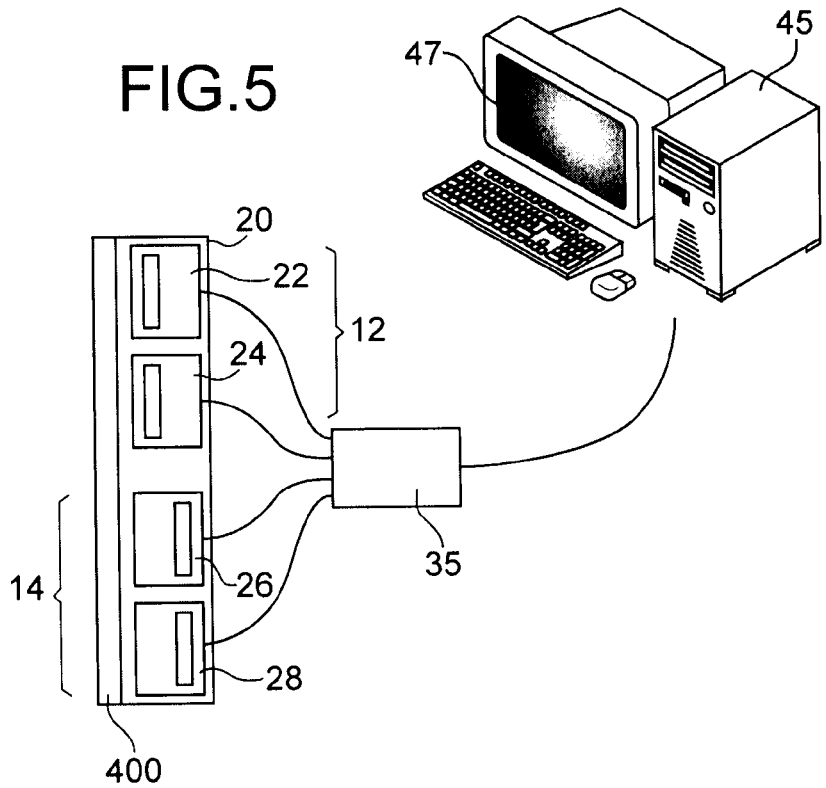
FIG. 5 again shows a system according to the invention including a sensor according to the invention and data processing means.

FIG. 5 shows a device according to the invention and data processing means.

In this figure, the two illustrated sensors 12, 14 are associated with a means 35 that groups together, for example, filter and data processing means, possibly amplification means. The two sensors are those of FIG. 3, but the data processing means described here can be applied to any configuration described in this application.

FIG. 4 shows a microcomputer 45 configured to be adapted for processing the gradient data that results from the measurements done by the sensors.

This microcomputer 45 includes a computing section with all of the electronic components, software, etc. that will make it possible to perform the desired processing.

Thus, for example, the system 45 includes a programmable processor, a memory and an input peripheral, for example a hard drive, coupled to a frontside bus. The processor can for example be a microprocessor. Processing algorithms according to the invention, for computations from magnetic measurement data, include instructions that can be stored in the memory, and that make it possible to carry out processing according to any one of the embodiments of the present invention.

An ASIC performs all of the functions carried out by the means 35, 45.

A program, making it possible to carry out the process according to the invention, resides or is written on a support (for example: floppy disk or CD ROM or DVD ROM or removable hard drive or magnetic support) that can be read by a computer system or by the microcomputer 45.

The microcomputer 45 can also be connected to other peripheral devices. It is possible to display, on the monitor 47, data resulting from calculations done and graphics.

The measurement of the component in z (or in x) of the gradient of the component x of the field H at point M(x,y,z) may be obtained, from measurements of Hx at point M(x,y,z) then at point M'(x,y+Ty,z+$\Delta z$) (or (x+$\Delta x$,y+Ty,z)), by calculating the quantity:

$$\text{grad}_z H_x \approx (H_x(x,y+T_y,z+\Delta z)-H_x(x,y,z))/\Delta z \quad (1).$$

This formula is different from the formula of the prior art:

$$\text{grad}_z Hx \approx (Hx(x,y,z+\Delta z)-Hx(x,y,z))/\Delta z$$

For the gradient along x, we will have:

$$\text{grad}_x Hx \approx (Hx(x+\Delta x,y+Ty,z)-Hx(x,y,z))/\Delta x,$$

The 2nd order derivative is obtained by:

$$d^{(2)}(H_x)/dz^2 \approx [H_x(x,y+2T_y,z+2\Delta z)-2H_x(x,y+T_y,z+\Delta z)+H_x(x,y,z)]\times(1/\Delta z^2).$$

For the 2nd order derivative along x, we will have:

$$d^{(2)}(H_x)/dx^2 \approx [H_x(x+2\Delta x,y+2T_y,z)-2H_x(x+\Delta x,y+T_y,z)+H_x(x,y,z)]\times(1/\Delta x^2).$$

More generally, an n-th order derivative can be calculated from an n−1 order derivative using the formula:

$$\frac{d^{(n)} H_x(x,y,z)}{dz^{(n)}} \approx \left[\frac{d^{(n-1)}H_x}{dz^{(n-1)}}(x, y+T_y, z+\Delta z) - \frac{d^{(n-1)}H_x}{dz^{(n-1)}}(x,y,z)\right] \times \frac{1}{\Delta z}$$

or $$\frac{d^{(n)} H_x(x,y,z)}{dx^{(n)}} \approx \left[\frac{d^{(n-1)}H_x}{dx^{(n-1)}}(x+\Delta x, y+T_y, z) - \frac{d^{(n-1)}H_x}{dx^{(n-1)}}(x,y,z)\right] \times \frac{1}{\Delta x}$$

In the more general case, it is possible to use any approximation formula making it possible to calculate $d^{(n)}(H_x)/dz^n$, (or $d^{(n)}(H_x)/dx^n$) of the type:

$$\frac{d^{(n)} H_x(x,y,z)}{dz^{(n)}} \approx \sum_{(i=1)}^{(N)} \alpha_i H_x(x+x_0, y+y_0, z+z_0+i\Delta z)$$

or $$\frac{d^{(n)} H_x(x,y,z)}{dx^{(n)}} \approx \sum_{(i=1)}^{(N)} \alpha_i H_x(x+x_0+i\Delta x, y+y_0, z+z_0)$$

where the vector $t(x_0,y_0,z_0)$ allows recentering of the measurement and the coefficients $\alpha_i$ can depend on $\Delta z$ (or on $\Delta x$).

According to the invention the derivative is calculated by:

$$\frac{d^{(n)} H_x(x,y,z)}{dz^{(n)}} \approx \sum_{(i=1)}^{(N)} \alpha_i H_x(x+x_0, y+y_0+iT_y, z+z_0+i\Delta z)$$

or:

$$\frac{d^{(n)} H_x(x,y,z)}{dx^{(n)}} \approx \sum_{(i=1)}^{(N)} \alpha_i H_x(x+x_0+i\Delta x, y+y_0+iT_y, z+z_0)$$

The same device may possibly be used to calculate a current i circulating in a conductor 1. From gradient measurements, the current is obtained by:

$$i=-2\Pi z^2 dH_x/dz$$

or $$i \approx 2(\Pi/x)r^3 dH_x/dx, (r=(x^2+z^2)^{1/2})$$

More generally, from the n=2 order derivative, we have:

$$i=\Pi z^3 d^{(2)} H_x/dz^{(2)}$$

or $$i=2\Pi[r^3/(3(x/r)^2-1)]d^2H_x/dx^2$$

or, from the n>2 order derivative:

$$i=(-1)^n(2\Pi/n!)z^{n+1}d^{(n)}H_x/dz^{(n)}$$

The desired order can also be derived from the above formulas.

Alternatively, a processing circuit of the signal (for example of the ASIC type) can be produced on the same chip as the device according to the invention. In this case, the chip integrates all or some of the processing functions of the signal that were described above.

A device according to the invention also makes it possible to better tolerate the presence of any shielding.

Figure 6A:
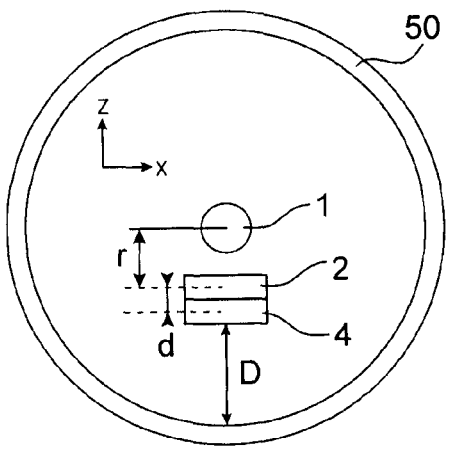
FIGS. 6A and 6B show configurations of a device with shielding, according to the invention (FIG. 6A) and according to the prior art (FIG. 6B).

Thus, in FIG. 6A, two sensors 2, 4 are shown according to any one of the embodiments of the invention, positioned near a conductor 1. The assembly is surrounded by a shielding 50. The sensor 4 closest to the shielding 50 is situated at a distance D therefrom.

Figure 6B:
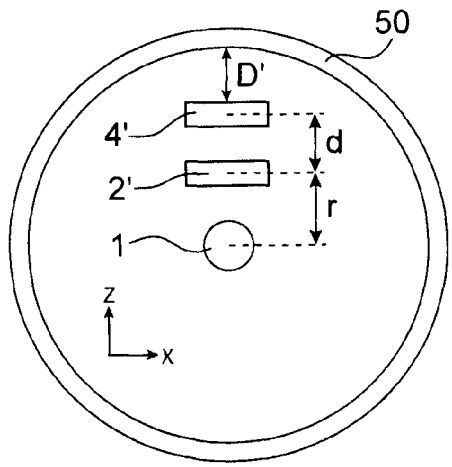

FIG. 6B only differs from FIG. 6A by the sensors used. This figure shows two sensors 2', 4' positioned according to one of the configurations of document U.S. Pat. No. 6,154,023. The top sensor 4', closest to the shielding 50, is situated at a distance D', smaller than D, therefrom. The sensor 4' is therefore more disrupted by the shielding than the sensor 4 of FIG. 6A.

Indeed, it is entirely possible to produce a device according to the invention with a deviation Δz from 1 μm to several hundreds of μm between two successive elementary sensors 2, 4. These dimensions are small enough to be able to position the sensors fairly far from the shielding 50 (typically from a few mm to a few cm) so that they are not disrupted—or are disrupted as little as possible—by the latter part. In the traditional case of a gradient measurement with two sensors stacked one on the other (FIG. 6B), the distance separating the elementary sensors is difficult to make less than a mm (given the thickness of the "packaging" associated with each sensor) and in a limited space; the outermost elementary sensor 4' is then located closer to the shielding 50 than in the case of the invention (FIG. 6A).

The invention makes it possible to measure the gradient of a component (for example x) of a field H, by measuring two values $H_{x1}$ and $H_{x2}$ of this field in at least two very close positions $M_1$ and $M_2$. The presence of the magnetic circuit of the sensor measuring the field $H_{x1}$ does not disrupt the measurement of the field $H_{x2}$, like the presence of the magnetic circuit measuring the field $H_{x2}$ does not disrupt the measurement of the field $H_{x1}$.

It also makes it possible to perform measurements in one direction (for example z) of the greater n-th order derivatives of the components of the magnetic field: $2=d^{(2)}(H_x)/dz^2$ order, $3=d^{(3)}(Hx)/dz^3$ order, etc. . . . . It will be recalled here that, with N (N>1) sensors positioned according to the invention, it is possible to perform measurements making it possible to calculate the derivatives up to the N−1 order.

Figure 8:
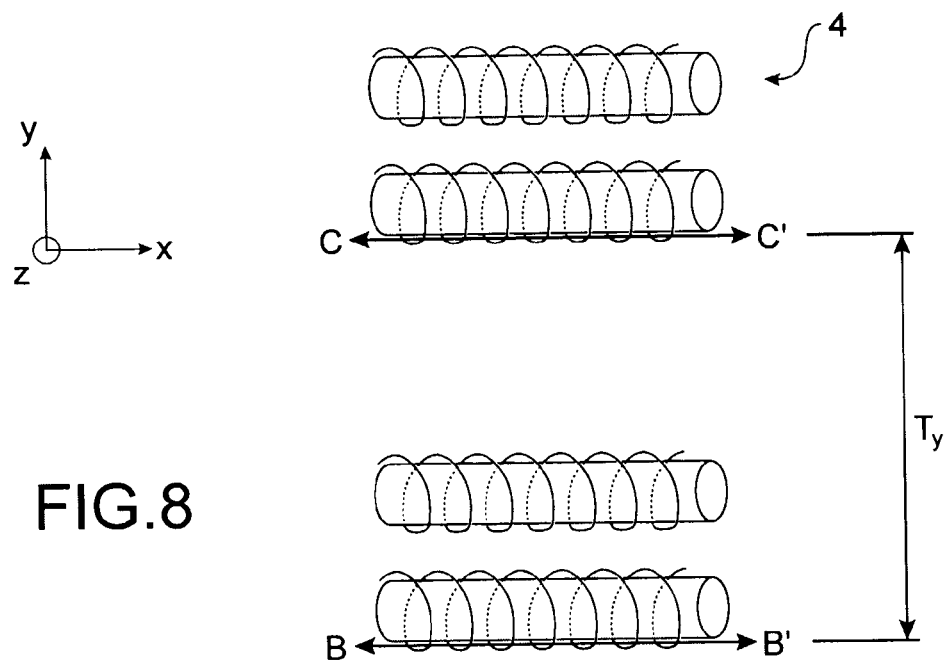
Figure 7A:
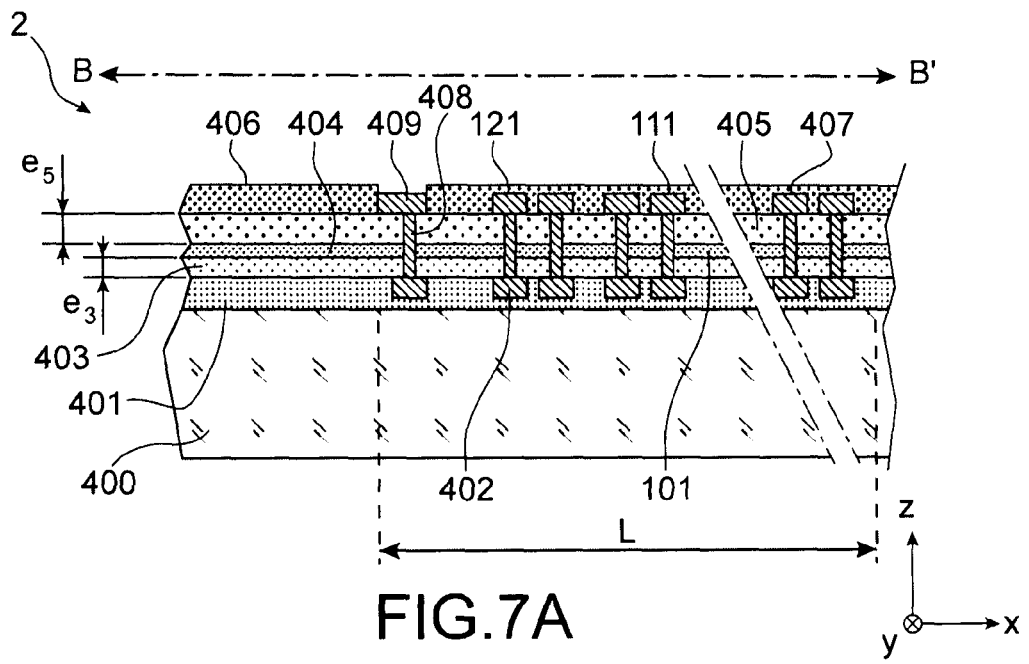
FIGS. 7A and 7B show cross-sectional views, along two axes, of two elementary sensors according to the invention, FIG. 8 showing the positioning of those two sensors in a reference xyz.
Figure 7B:
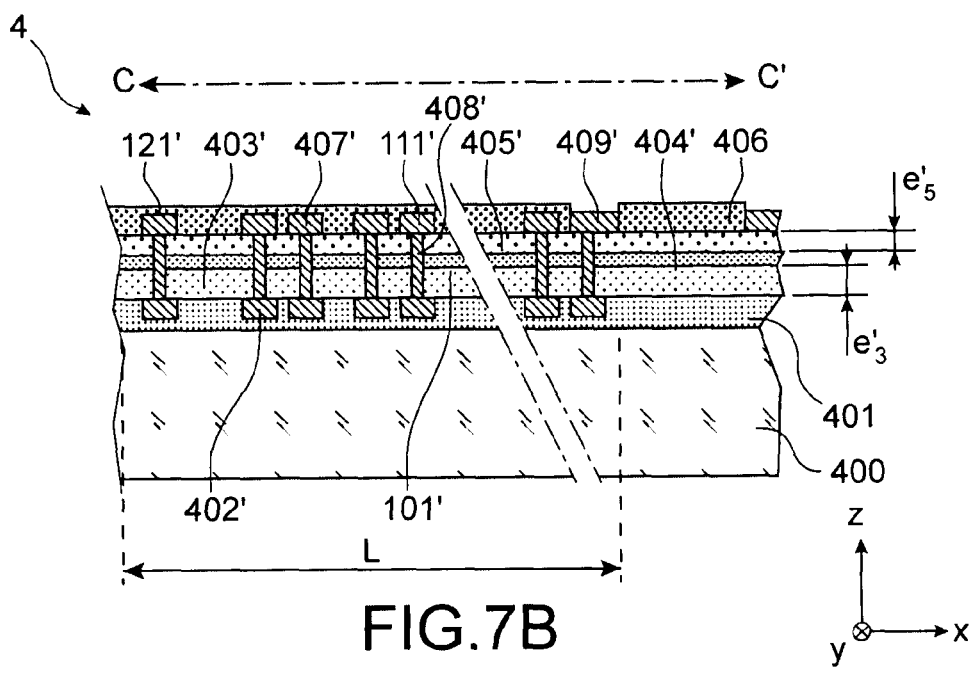

The sensors of a device according to the invention can be made in thin layers. FIGS. 7A and 7B show two cross-sectional views along axes BB' and CC' of part of such a device, with two elementary sensors 2, 4 (here each of the dual core micro-fluxgate type). An orthonormal reference in the margin of these figures indicates the respective directions of the x, y and z axes. FIG. 8 diagrammatically indicates the position of the two elementary sensors in relation to reference Oxyz, the cutting planes BB' and CC' of FIGS. 7A and 7B intersect the conductors at connection vias.

The structure of these figures can be generalized to any number N (N>2) of individual sensors.

Each of the two elementary sensors here is made from a stack of thin layers. A lower insulating layer 401, for example with a base of an insulating material such as $SiO_2$ or such as a photosensitive polymer with a thickness for example between 1 and 10 micrometers, for example equal to 5 micrometers, rests on a substrate 400, for example silicon-based. Since the substrate 400 can initially be shared by the two sensors, certain numerical references are the same in both FIGS. 7A, 7B. The lower insulating layer 401 includes lower portions 402, 402' of field coils 121, 121' and detecting coils 111, 111'. In each sensor, the detecting and field coils can overlap or be separated. The lower coil portions 402, 402' assume the form of conductive lines extending in a direction substantially parallel to the y axis and parallel to a main plane of the substrate 400. The lower coil portions 402, 402' also have a rectangular shape in this example. Moreover, these lower coil portions 402, 402' can be made with a base of metal materials, for example copper, aluminum, gold.

A first dielectric layer 403, 403', for example with a base of $SiO_2$, rests on the lower insulating layer 401. The thickness e3 of the layer 403 is different from the thickness e'3 of the layer 403', here e3<e'3. The difference between these two thicknesses will be the distance deviation Δz of FIG. 2 or 3 in relation to the conductor 1 (when this conductor is positioned along direction Oy). Each of these two thicknesses can be between 1 and 10 micrometers, for example.

Each dielectric layer 403, 403' is inserted between the lower portions 402, 402' of the coils 121, 121' and 111, 111' situated below it and a magnetic core 101, 101' contained in a dielectric layer 404, 404' situated above it. Thus, the magnetic core 101, 101' and the lower portions 402, 402' of the coils are insulated.

Each magnetic core 101, 101' extends in a direction parallel to the x axis over a length noted L. It can be made with a base of a magnetic material such as a magnetically soft material, a magnetically amorphous material, or an alloy such as an iron- and nickel-based alloy (NiFe, or permalloy, can be deposited by physical vapor deposition (PVD) or by electrodeposition). Each core can be formed in a single layer or a stack of several layers of different materials and have a thickness for example between 500 nanometers and 20 μm, for example close to 2 μm.

On each layer 404, 404' containing the core 101, 101' is a second dielectric layer 405, 405', for example with a base of $SiO_2$.

The thickness e5 of the layer 405 is different from the thickness e'5 of the layer 405', here e'5>e5, preferably such that this thickness different offsets the thickness difference, in the opposite direction, between the layers 403 and 403' and that the entire device keeps a uniform thickness of its entire length. Preferably, we therefore substantially have: e5−e'5≈e'3−e3. The difference between these two thicknesses e5 and e'5 is then also in the vicinity of the distance deviation Δz of FIG. 1 or 2 in relation to the conductor 1 (when this conductor is positioned along direction Oy). Each of the layers 405, 405' can have a thickness typically between 1 μm and 10 μm.

The second dielectric layer 405, 405' serves as insulation between the core 101, 101' situated below it and upper portions 407, 407' of the coils 111, 111' and 121, 121' situated above it and inserted into a layer 406 situated on the dielectric layers 405, 405'. The thickness differences indicated above between the layers 403, 403' on one hand and 405, 405' on the other make it possible to have a layer 406 with a uniform thickness over the entire device.

The upper coil portions 407, 407' assume the form of conductive lines extending in a direction substantially parallel to Oy and parallel to a main plane of the substrate. These upper coil portions 407, 407' have a rectangular shape and can be made with a base of metals, for example copper, aluminum, gold.

The layers 403, 403', 404, 404', 405, 405' are pierced so as to receive vertical connectors 408, 408', for example metal-based, joining the lower portions 402, 402' and the upper portions 407, 407' of the coils 111, 111' and 121, 121'.

The lower 402, 402' and upper 407, 407' portions of the coils 111, 111' and 121, 121' connected by the vertical connectors 408, 408' produce turns having an approximately or quasi-rectangular shape, winding in a spiral or along the cores 101, 101'.

Connecting lugs 409, 409', for example metal-based, are also inserted into the layer 406 and for example serve for the passage of current from outside circuits towards the various coils or from the various coils towards outside circuits.

Consequently, to produce sensors with distinct distances in relation to the substrate, the insulating layer 403 can be made more fine under the core of one of the elementary sensors than under the core of an adjacent elementary sensor. The opposite can be done for the layer 405, such that the total thickness of the stacks of elementary sensors is the same. To produce a layer 403, 405' that is locally more fine, it is for example possible to deposit a thick layer and locally etch it at the locations where one wishes to make it more fine.

In the case of a device implemented in the context of a process as described above in connection with FIG. 4, it is not necessary to produce different thicknesses between the layers of an elementary sensor and an adjacent sensor. In this case, the structure of FIGS. 7A and 7B is simplified, all of the layers having the same thicknesses from one sensor to the next.

A process for producing an individual sensor can be obtained from the method described in document FR 2 860 594.

Steps of that production method, for a single sensor, are given in the aforementioned document in connection with FIGS. 5a-5g, without taking into account the feature, indicated in said document, according to which the field coils protrude in relation to the ends of the magnetic cores.

As explained above, during the production of this method, the thicknesses of the layers 403, 403', 405, 405' may be adapted, for example by etching of thicker layers.

The invention makes it possible to reduce the disruptions caused by parasitic conductors. It is applicable to current measurement by field sensors (contactless) that is not very influenced by external magnetic disruptions. It is also applicable to any other gradient measurement of a component of the magnetic field in an environment where the field is invariant (at least locally) in one direction.

There are number fields of use for the current measurement, such as:
  assessing electrical consumption in industrial buildings, residences or transportation means (automobile, aviation, boat),
  protective functions (triggering circuit breakers) in the same environments,
  protection of electric engines whereof the costly copper windings are better off avoiding the strong currents that deteriorate the insulators and cause short circuits,
  detecting and positioning buried cables,
  measuring currents caused in non-destructive testing or searching for metals.

The adjustment of the offset $T_y$ can be calculated, simulated or done experimentally in the design phase, as explained below, and makes it possible to determine an optimal value of $T_y$ for the desired sensor.

We will now indicate a process for determining $T_y$ in order to minimize the interactions of the magnetic circuits with each other, knowing that these interactions decrease greatly when the distance increases. In other words, this is a method making it possible to dimension $T_y$ to perform a measurement according to the invention with a determined precision.

Let us assume that we wish to perform a measurement of a gradient or an n-th order derivative along the z axis, of a component Hx of the magnetic field whereof the order of magnitude is "h" with a precision of "p %". Let us therefore assume that the total admissible error for the measurement is: $h \cdot p/100$ and that 2 field measurements are done (for example to measure the gradient). For each field measurement, we will tolerate an error at most equal to:

$$(\tfrac{1}{2}) \cdot h \cdot p/100 = h \cdot p/200.$$

In order to best adjust the suitable offset Ty between the elementary sensors on the y axis, we may for example position a first elementary sensor in a situation to measure the field h (that will be created constant for the purposes of this dimensioning), then, when the measurement is stabilized, progressively bringing the second sensor close to the first on the y axis while continuing to perform measurements of the field h with this first sensor. During the approach of the second sensor, a variation of the measurement of the field h will be observed, since the magnetic circuit of the second sensor disrupts the measurement of the first. The "Ty min" deviation can be noted between the two elementary sensors when the result of the measurement done by the first sensor deviates from "h·p/200" by the exact value h. It is then sufficient to provide for the manufacture of the global sensor according to the invention with the elementary sensors offset by at least this value Ty min.

Alternatively, it is possible to perform a digital simulation instead of an experimental performance to calculate this value Ty min (for example with software for computing the magnetic field using finite elements such as, for example FLUX 3D or ANSYS), and to take a safety coefficient for the individual or collective manufacture of the sensors with Ty>Ty min.

For a measurement involving N sensors (case of a measurement for an n=N−1 order derivative of the field Hx), a computation will need to be done involving a weighted sum of N measurements. It will therefore be advisable to limit the maximum admissible error for each elementary sensor to, at most, $h \cdot p/(100 \cdot N)$ and even more cautiously to $h \cdot p/(100 \cdot 2^n)$ because there are N sensors, but the computation formula involves using a linear combination of $2^n$ measurements.

The invention claimed is:

1. A process that measures a gradient (n=1), or an n-th order derivative with n greater than 1, in a direction z or x, of a component Hx of a magnetic field, the component being invariant, at least locally, in a direction y (x, y, and z being perpendicular two by two), the process comprising:
  a) positioning of N (N≧n+1) elementary field sensors in a zone in which the magnetic field component is invariant in a direction y, and each sensor being offset, in relation to the preceding and/or following sensor:
    along y, by a distance $T_y$,
    along the z axis by a distance $\Delta z$, or along the x axis by a distance $\Delta x$;

b) measuring the field by each of the N sensors; and
c) calculating, by a computer, a processor, or an integrated circuit, a value of a gradient, or the n-th order derivative, as a function of the measurement values of the field obtained during the measurement, and using, by the computer, the processor, or the integrated circuit, the value of the gradient or the n-th order derivative to determine an electrical current flowing in a conductor external to the N sensors.

2. The process according to claim 1, in which the sensors are microsensors.

3. The process according to claim 1, in which the sensors are integrated on a shared substrate.

4. The process according to claim 1, in which the sensors are aligned along an axis forming an angle α with the y axis.

5. The process according to claim 1, in which the sensors are aligned along an axis forming an angle α with the y axis, the angle α being between 1° and 15°.

6. The process according to claim 1, in which:
n=1 and the component is calculated, along the z or x axis, of the gradient of the component Hx using formula:

$$\mathrm{grad}_z H_x \approx (H_x(x,y+T_y,z+\Delta z) - H_x(x,y,z))/\Delta z,$$

or $$\mathrm{grad}_x H_x \approx (H_x(x+\Delta x,y+T_y,z) - H_x(x,y,z))/\Delta x,$$

or n=2 and the component is calculated, along the z or x axis, of the 2nd order derivative of the component Hx using formula:

$$d^{(2)}(H_x)/dz^2 \approx [(H_x(x,y+2T_y,z+2\Delta z) - 2H_x(x,y+T_y,z+\Delta z) + H_x(x,y,z)] \times (1/\Delta z^2),$$

or:

$$d^{(2)}(H_x)/dx^2 \approx [(H_x(x+2\Delta x,y+2T_y,z) - 2H_x(x+\Delta x,y+T_y,z) + H_x(x,y,z)] \times (1/\Delta x^2),$$

or n>2 and the component is calculated, along the z or x axis, of the n-th order derivative of the component Hx using formula:

$$\frac{d^{(n)} H_x(x,y,z)}{dz^{(n)}} \approx \left[ \frac{d^{(n-1)} H_x}{dz^{(n-1)}}(x, y+T_y, z+\Delta z) - \frac{d^{(n-1)} H_x}{dz^{(n-1)}}(x, y, z) \right] \times \frac{1}{\Delta z}$$

or:

$$\frac{d^{(n)} H_x(x,y,z)}{dx^{(n)}} \approx \left[ \frac{d^{(n-1)} H_x}{dx^{(n-1)}}(x+\Delta x, y+T_y, z) - \frac{d^{(n-1)} H_x}{dx^{(n-1)}}(x, y, z) \right] \times \frac{1}{\Delta x}$$

or, in a more general case, the following formula:

$$\frac{d^{(n)} H_x(x,y,z)}{dz^{(n)}} \approx \sum_{(i=1)}^{(N)} \alpha_i H_x(x+x_0, y+y_0+iT_y, z+z_0+i\Delta z)$$

or:

$$\frac{d^{(n)} H_x(x,y,z)}{dx^{(n)}} \approx \sum_{(i=1)}^{(N)} \alpha_i H_x(x+x_0+i\Delta x, y+y_0+iT_y, z+z_0)$$

where the vector $(x_0, y_0, z_0)$ allows recentering of the measurement and the coefficients $\alpha_i$ can depend on $\Delta z$ (or on $\Delta x$).

7. The process according to claim 1, the determination of the current being done using formula:

$$i = -2\Pi z^2 dH_x/dz$$

or $$i = -2(\Pi/x) r^3 dH_x/dx,$$

with $$r = (x^2 + z^2)^{1/2}$$

or, from the n=2 order derivative:

$$i = \Pi z^3 d^{(2)} H_x/dz^{(2)}$$

or $$i = 2\Pi [r^3/(3(x/r)^2 - 1)] d^2 H_x/dx^2$$

or, from the n>2 order derivative:

$$i = (-1)^n (2\Pi/n!) z^{n+1} d^{(n)} H_x/dz^{(n)}$$

or according to a formula obtained, by derivation at the n-th order derivative, from the formulas above.

8. The process according to claim 1, in which each sensor is of micro-fluxgate, magneto-resistive type, AMR, GMR or TMR, or of magneto-impedance.

9. The process according to claim 1, the distance $T_y$ being greater than a minimum distance $T_{ymin}$, predetermined such that magnetic disruption caused by one of the sensors does not influence measurements done by its or their adjacent sensors.

10. A device for measuring a gradient or an n>1 order derivative, in a direction z or in a direction x, of a component Hx of a magnetic field, the component being invariant, at least locally, in a direction y (x, y, and z being perpendicular two by two), the device comprising:
N elementary field sensors, N being greater than or equal to n+1, positioned in a zone in which the magnetic field component is invariant in a direction y, each sensor being offset, in relation to the preceding and/or following sensor:
along y, by a distance $T_y$,
along the z axis, by a distance $\Delta z$, or along the x axis, by a distance $\Delta x$;
means for calculating a value of the gradient or the n-th order derivative, as a function of the measurement values of the field obtained using the sensors; and
means for using the value of the gradient or the n-th order derivative to determine an electrical current flowing in a conductor external to the N sensors.

11. The device according to claim 10, in which the sensors are microsensors.

12. The device according to claim 10, in which the sensors are integrated on a shared substrate.

13. The device according to claim 10, further comprises shielding means that surrounds the sensors.

14. The device according to claim 10, in which each sensor is of micro-fluxgate, or magneto-resistive, or AMR, GMR or TMR, or of magneto-impedance.

15. The device according to claim 10, the distance $T_y$ being greater than a minimum distance $T_{ymin}$, predetermined such that magnetic disruption caused by one of the sensors does not influence measurements done by its or their adjacent sensors.

16. A process that measures an n-th order derivative with n greater than 1, in a direction z or x, of a component Hx of a magnetic field, the component being invariant, at least locally, in a direction y (x, y, and z being perpendicular two by two), the process comprising:

a) positioning of N (N≧n+1) elementary field sensors in a zone in which the magnetic field component is invariant in a direction y, and each sensor being offset, in relation to the preceding and/or following sensor:
   along y, by a distance $T_y$,
   along the z axis by a distance $\Delta z$, or along the x axis by a distance $\Delta x$;
b) measuring the field by each of the N sensors; and
c) calculating, by a computer, a value of the n-th order derivative, as a function of the measurement values of the field obtained during the measurement, and using, by the computer, the value of the n-th order derivative to determine an electrical current flowing in a conductor external to the N sensors.

\* \* \* \* \*